United States Patent [19]

Klein

[11] 3,875,514

[45] Apr. 1, 1975

[54] CIRCUIT FOR SWITCHING THE AUDIO FREQUENCY OUTPUT IN AN AM-FM BROADCAST RECEIVER

[75] Inventor: Eberhard Klein, Hildesheim, Germany

[73] Assignee: Blaupunkt-Werke GmbH, Hildesheim, Germany

[22] Filed: Apr. 26, 1974

[21] Appl. No.: 464,557

[30] Foreign Application Priority Data

May 23, 1973 Germany .............................. 232614

[52] U.S. Cl. ...................... 325/316, 325/318, 329/1, 329/146

[51] Int. Cl. .............................................. H04b 1/06

[58] Field of Search ........................... 325/315–318, 325/302, 306, 393; 343/176, 205; 329/1, 2, 101, 103, 146, 147

[56] References Cited

UNITED STATES PATENTS 3,201,695 8/1965 Mason et al. ....................... 325/315

*Primary Examiner*—Robert L. Griffin
*Assistant Examiner*—Marc E. Bookbinder
*Attorney, Agent, or Firm*—Flynn & Frishauf

[57] ABSTRACT

In an AM-FM receiver, a switching arrangement including an emitter follower transistor circuit is provided which is coupled to the outputs of the AM and FM demodulator. The output or load resistance of the AM demodulator forms a part of the emitter follower switching circuit. When the emitter follower is active, the FM signal is supplied to the audio output circuits of the receiver, and when the emitter follower is blocked (or cutoff), the AM outputs are supplied to the audio circuits of the receiver.

15 Claims, 2 Drawing Figures

CIRCUIT FOR SWITCHING THE AUDIO FREQUENCY OUTPUT IN AN AM-FM BROADCAST RECEIVER

This invention relates to a circuit arrangement for switching the audio frequency (AF) in a combined AM-FM broadcast receiver, and more particularly to such an arrangement wherein the input of the audio amplifier may be selectively connected to either of the outputs of the AM and FM demodulators which correspond to the ranges of reception.

Broadcast receivers intended for reception of both amplitude modulated (AM) and frequency modulated (FM) radio frequency (RF) oscillations require a connection of the audio frequency (AF), obtained from the AM or FM demodulator, respectively, to the input of the audio amplifier of the receiver.

It is well known to use mechanical switching contacts for switching the AF. As to broadcast receivers equipped with an electronic band switching arrangement, which is of great advantage, especially for remote control, it is well known to switch over the AF by means of switching diodes. However, for use with AF signals, these prior switching devices require great expenditure, since means must also be provided for decoupling the AF signls from the switching circuits. The decoupling resistances supplying the switching currents cause, due to voltage divisions and additional dampings of the demodulator outputs, undesired voltage losses at a point which is critical for the signal-to-noise ratio of the AF channel, thereby adversely affecting performance of the receiver.

The object of the present invention is to feed the AF of the demodulator outputs, by way of electronic switching, to the input of the audio amplifier with minimal quantity of circuit elements required, thereby simplifying construction, lowering cost and improving performance and reliability.

SUMMARY OF THE INVENTION

According to the present invention, the output of the FM demodulator is connected, via a coupling capacitor, to the base of a transistor which is arranged as an emitter follower and which is active during FM reception. The emitter resistor of the transistor simultaneously operates as a load (or output) resistance of a conventional AM demodulator. The circuit arrangement functions such that the AF signal being supplied by the FM demodulator may be obtained at the emitter of the transistor when the emitter follower is active, and that the demodulator diode of the AM demodulator is simultaneously blocked (or cutoff) by the emitter voltage. When the emitter follower is not active, the signal supplied by the AM demodulator is present at the terminal of the emitter of the transistor, and the emitter-base path of the transistor is simultaneously reverse biased.

The main advantages achieved by the present invention are that the arrangement, appropriate for switching the AF electronically, requires only a few circuit elements, does not damp the outputs of the demodulators, and thus permits a switching of the AF without losses.

Moreover, the circuit arrangement of the present invention may advantageously be provided with a muting device by feeding a direct current, across a diode, to that end of the emitter resistor which is not connected to ground, said direct current blocking both the diode of the AM demodulator and the emitter-base path.

DESCRIPTION OF ILLUSTRATED EMBODIMENTS

Figure 1:
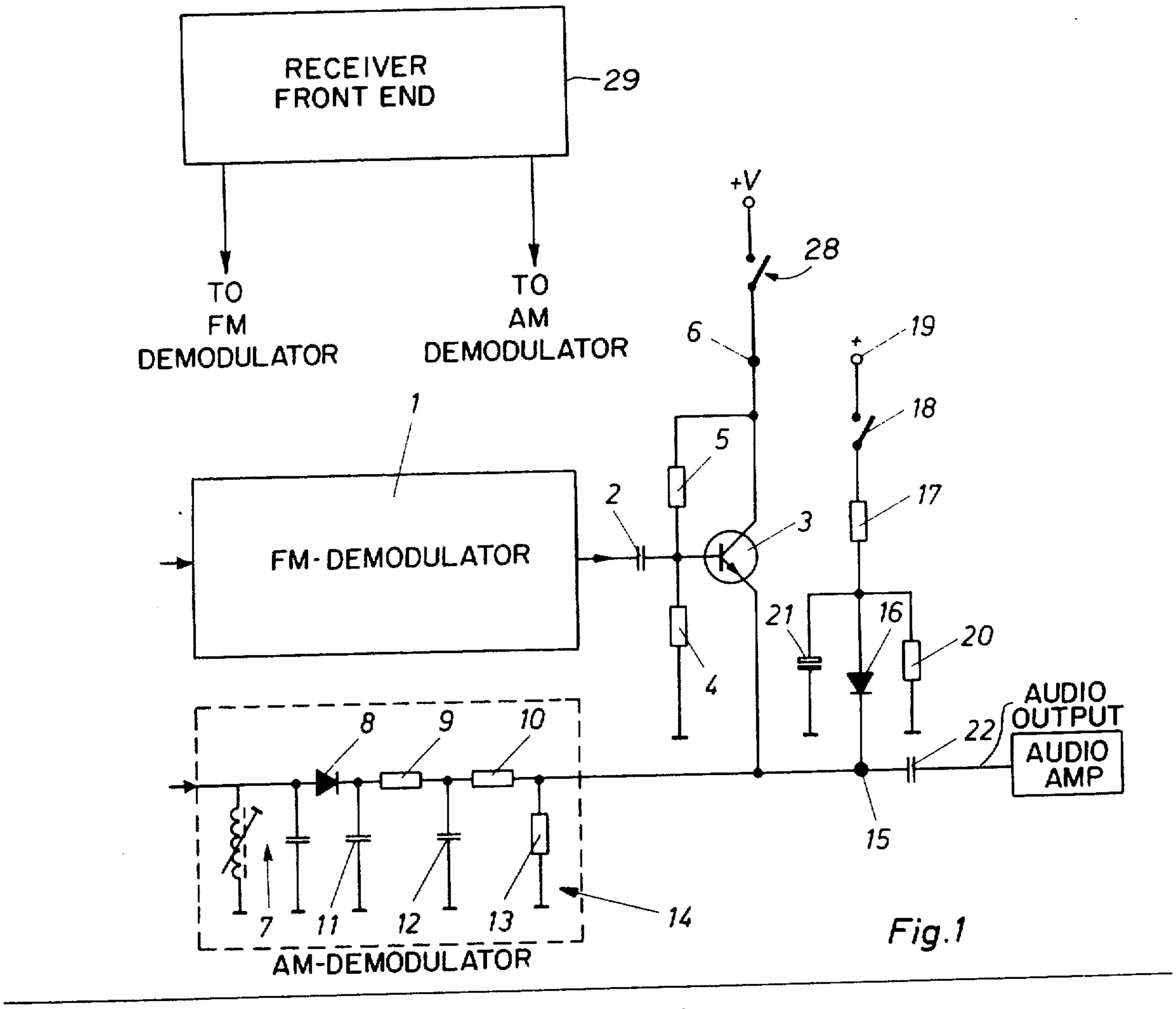
FIG. 1 shows a circuit arrangement according to the present invention for electronically switching the AF, and which is provided with an additional muting device.

Referring to FIG. 1, a receiver front end 29 (i.e., including the RF stages) has outputs coupled to the AM demodulator 14 and FM demodulator 1, respectively. The outputs of the demodulators are fed to a switching circuit (to be described below), the output of which is fed to the audio amplifier 30.

The output of a conventional FM demodulator 1, the internal construction of which may be conventional and is not shown in detail in FIG. 1, is connected via a coupling capacitor 2 to the base of a transistor 3 which acts as an emitter follower. The base of transistor 3 is coupled to ground via a resistor 4, and is coupled to the collector of transistor 3 via a further resistor 5. A positive operating voltage V is supplied to the collector of transistor 3 at a first terminal 6 via a switch 28 which is further described later. The emitter of the transistor 3 is connected to the output of a conventional AM demodulator 14 which includes a resonant circuit 7, a diode 8, resistors 9 and 10, and capacitors 11, 12, and which has a load or output resistance 13. The load resistance 13 is coupled at one end to ground and is coupled at the other to the emitter of transistor 3. The cathode of a switching diode 16 is connected to the emitter of transistor 3 via terminal 15, the anode of the switching diode 16 being connected to a second terminal 19 of a positive operating voltage source via the series combination of a resistor 17 and a switch 18. The anode of diode 16 is coupled to ground via a resistor 20 which is connected in parallel with a capacitor 21.

During AM reception, the switch 28 is open and the first terminal 6 is dead (i.e., has no voltage supplied thereto). This is easily achieved by connecting the terminal 6, via the switch 28 (which may be termed a selector switch) to a DC power line of the FM tuner, such as the power supply of the oscillator. Hence, the emitter follower is not active (i.e., the transistor 3 is nonconducting and presents a high impedance to the AM demodulator 14) during AM reception. After demodulation has been performed, an AF signal comprising a DC component develops at the load or output resistance 13 of the AM demodulator 14. This AF signal is fed to the audio amplifier of the receiver through a blocking capacitor 22 which blocks the DC component. Diode 8 of the AM demodulator 14 serves for rectification, and is biased in such a way that the DC component of the signal is positive, and thus blocks the emitter-base path of transistor 3.

During FM reception, the switch 28 is closed and the emitter follower is supplied with an operating voltage at terminal 6, and is thus active. In this condition, the load resistance 13 of the AM demodulator 14 acts as the emitter resistor of the emitter follower. The direct current, flowing through transistor 3 and through the load resistance 13 of the AM demodulator 14, produces a positive direct voltage at the load resistance 13, said positive direct voltage reverse biasing (i.e., blocking) diode 8 of the AM demodulator 14. The AF signal which is supplied from the FM demodulator 1 to the base of transistor 3 via a coupling capacitor 2, is amplified in the emitter follower, and also reaches the input of the audio amplifier via the blocking capacitor 22.

If, during a switching or automatic station finding operation, the AF signal is to be muted, a positive voltage is fed, by means of closing switch 18, to the voltage divider which comprises resistors 17 and 20. The path from the junction point of resistors 17 and 20 through switching diode 16 to the load resistance 13 is current carrying. By way of a corresponding choice of values for resistors 17 and 20 of the voltage divider, the value of the current flowing through this current path is to be dimensioned such that the voltage present at the emitter terminal 15 is positive with respect to the voltage at the base of transistor 3. Thereby, both the transistor 3 and diode 8 of the AM demodulator are blocked, thus performing the muting function. Capacitor 21, which is connected in parallel with resistor 20, prevents a sudden switching-in of the muting device. If it is not desired to set the muting device in action gradually, capacitor 21 may be eliminated.

Figure 2:
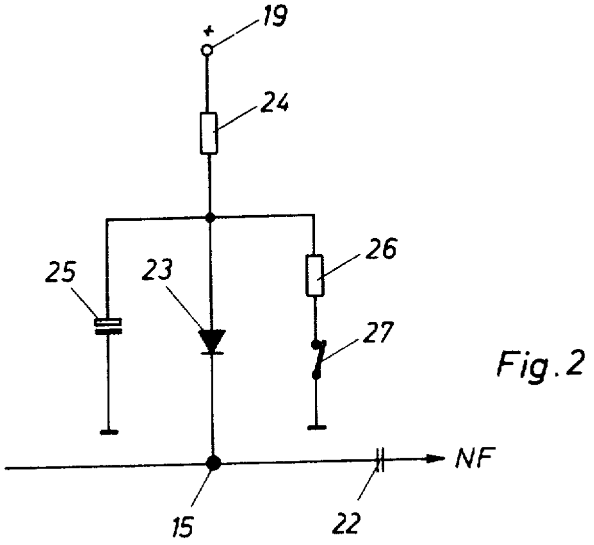
FIG. 2 shows a further example of a circuit arrangement for muting.

If muting is desired to be implemented by means of a switch which is grounded at one end, a circuit arrangement as shown in FIG. 2 is advantageous. In FIG. 2, the emitter terminal 15 is connected to the cathode of a switching diode 23, the anode of the diode 23 being connected to power source terminal 19 via a resistor 24. The anode of switching diode 23 is connected to ground via a capacitor 25, and is further connected to resistor 26 which is in series with switch 27 which is grounded at one end. Switch 27 may be replaced by an equivalently operating switching transistor.

In the FIG. 2 arrangement, when switch 27 is closed, the value of the voltage appearing at the anode of the diode 23 is so low that it lies below the threshold value of the switching diode 23, i.e., the diode is reverse biased or blocked. When switch 27 is opened, a current flows through the switching diode, and the voltage at the emitter terminal 15 rises to a value sufficient to block both transistor 3 and diode 8 of the AM demodulator 14, thus performing the muting function. Capacitor 25 has the same function as capacitor 21 of FIG. 1.

Various alterations and changes can be made to the illustrated embodiments of the invention within the scope of the inventive concept, as set forth in the appended claims.

I claim:

1. Circuit arrangement for switching the audio frequency (AF) in a combined AM-FM broadcast receiver having AM and FM demodulators, the AM demodulator having an output load resistor from which the output of the AM demodulator is obtained and a demodulator diode coupled to the load resistor, the switching circuit arrangement comprising:

an emitter follower amplifier including at least one transistor, the emitter electrode of said emitter follower transistor being coupled to said load resistor of said AM demodulator, said load resistor serving as the emitter resistor of said transistor;

means coupling the output of the FM demodulator to the base electrode of said emitter follower transistor;

the output from the emitter of the emitter follower transistor including an audio signal; and control means coupled to said emitter follower transistor for respectively saturating and cutting off said emitter follower transistor by changing the base-emitter junction bias accordingly so that (1) the FM signal is obtained from the emitter of said emitter follower transistor, and the demodulator diode of the AM demodulator is blocked by the emitter voltage when said emitter follower transistor is saturated, and (2) the AM signal is obtained from the emitter of said emitter follower transistor, and the FM signal is cutoff when the emitter follower is blocked.

2. Circuit arrangement according to claim 1 wherein said means coupling the output of the FM demodulator to the base electrode of said emitter follower transistor comprises a coupling capacitor.

3. Circuit arrangement according to claim 1 wherein said control means comprises switching means selectively coupling said emitter follower amplifier to a source of DC power.

4. Circuit arrangement according to claim 3 wherein said DC power source comprises a DC power line of the FM tuner of said receiver.

5. Circuit arrangement according to claim 4 wherein said switching means includes an AM-FM selector switch.

6. Circuit arrangement according to claim 3 wherein said switching means selectively couples the collector electrode of said emitter follower transistor to said DC power source.

7. Circuit arrangement according to claim 6 wherein said emitter follower transistor is conducting when said switching means connects the collector of said transistor to said DC power source, and is cutoff when said switching means disconnects the collector of said transistor from said DC power source.

8. Circuit arrangement according to claim 1 including muting means coupled to said emitter follower transistor for selectively blocking both said emitter follower transistor and said demodulator diode of said AM demodulator.

9. Circuit arrangement according to claim 8 wherein said muting means comprises: a switching diode coupled in series with a first resistor, the series combination of said switching diode and first resistor being coupled to the emitter electrode of the emitter follower transistor; a second resistor coupling the junction point between said switching diode and first resistor to a reference potential; and a muting switch coupling said series combination of said switching diode and first resistor to a source of DC potential whereby upon closing of said muting switch, the DC potential at the emitter of the emitter follower transistor increases to such a degree that both the demodulator diode of the AM demodulator and the emitter-base path of the emitter follower transistor are blocked, regardless of the condition of the control means, thereby blocking the AF signal.

10. Circuit arrangement according to claim 9 comprising a capacitor coupled in parallel with said second resistor to cause said muting means to gradually become effective upon closing of said muting switch.

11. Circuit arrangement according to claim 9 wherein said switching diode is connected to the emitter of said emitter follower transistor; and said first resistor is coupled in series between said switching diode and muting switch.

12. Circuit arrangement according to claim 8 wherein said muting means comprises: a switching diode coupled in series with a first resistor, the series combination of said switching diode and first resistor being coupled between a source of DC potential and the emitter electrode of the emitter follower transistor; and the series combination of a second resistor and a muting switch coupling the junction point between said switching diode and first resistor to a reference potential, said resistors being dimensioned such that when said muting switch is closed the switching diode of said muting means is reverse biased rendering said muting means inoperative, whereby upon opening of said muting switch, the DC potential at the emitter of the emitter follower transistor increases to such a degree that both the demodulator diode of the AM demodulator and the emitter-base path of the emitter follower transistor are blocked, regardless of the condition of the control means, thereby blocking the AF signal.

13. Circuit arrangement according to claim 12 comprising a capacitor coupled in parallel with said series combination of said second resistor and muting switch to cause said muting means to gradually become effective upon opening of said muting switch.

14. Circuit arrangement according to claim 12 wherein said switching diode is connected to the emitter of said emitter follower transistor; and said first resistor is coupled in series between said switching diode and said source of DC potential.

15. Circuit arrangement according to claim 1 in combination with said receiver which includes means for receiving AM and FM signals and coupling said signals respectively to AM and FM demodulators, and audio output means coupled to the output from the emitter of the emitter follower transistor.

* * * * *